(12) United States Patent
Matiash et al.

(10) Patent No.: US 9,195,259 B1
(45) Date of Patent: Nov. 24, 2015

(54) METHOD AND APPARATUS FOR CLOCK-GATING REGISTERS

(75) Inventors: Ofer Matiash, Petach-Tikva (IL); Ruven Torok, Tel Aviv (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 692 days.

(21) Appl. No.: 13/246,267

(22) Filed: Sep. 27, 2011

Related U.S. Application Data

(60) Provisional application No. 61/405,129, filed on Oct. 20, 2010.

(51) Int. Cl.
*G06F 1/04* (2006.01)
*G06F 9/30* (2006.01)

(52) U.S. Cl.
CPC .............. *G06F 1/04* (2013.01); *G06F 9/30098* (2013.01); *G06F 9/30109* (2013.01)

(58) Field of Classification Search
CPC .............. G06F 1/04; G06F 1/06; G06F 1/10; G06F 9/30098; G06F 9/30101; G06F 9/30105; G06F 9/30109; G06F 9/3012; G06F 9/30141; G06F 13/38; G06F 13/40
USPC ........ 713/300, 322, 500, 600–601; 710/8, 10, 710/52, 15–19; 711/1, 101
See application file for complete search history.

(56) References Cited

U.S. PATENT DOCUMENTS

| 5,793,672 | A  | * | 8/1998  | Wong et al. ................... 365/154 |
|-----------|----|---|---------|------------------------------------------|
| 5,834,961 | A  | * | 11/1998 | Hillan et al. .................. 327/295 |
| 8,099,703 | B1 | * | 1/2012  | Manovit et al. ............... 716/133   |
| 2003/0141901 | A1 | * | 7/2003  | Schulz ............................ 326/93 |
| 2006/0236278 | A1 | * | 10/2006 | Shimony .......................... 716/6 |
| 2007/0214437 | A1 | * | 9/2007  | Kajihara ........................... 716/1 |
| 2009/0249041 | A1 | * | 10/2009 | Damaraju et al. ............ 712/223 |
| 2010/0169675 | A1 | * | 7/2010  | Kajihara ........................ 713/300 |

OTHER PUBLICATIONS

"Marvell Introduces Prestera 98CX8234 The Industrys First Commercially Available 40 GbE Switching Solution". Marvell. Online May 18, 2009. Retrieved from Internet Jul. 30, 2014. <http://www.marvell.com/products/switching/Prestera_98CX8234_40_GbE_Switching_Solution/release/1300>.*

* cited by examiner

*Primary Examiner* — Thomas J Cleary (57) ABSTRACT

Aspects of the disclosure provide an integrated circuit. The integrated circuit includes a register configured to store multiple data units, a data input generation circuit configured to combine input data for at least partially overwriting the register with the stored multiple data units to generate combined input data, and a clock-gating circuit configured to provide to the register a logically controlled gated clock signal having selectively enabled transitions. The register is overwritten with the combined input data in response to the selectively enabled transitions in the gated clock signal.

20 Claims, 6 Drawing Sheets

METHOD AND APPARATUS FOR CLOCK-GATING REGISTERS

INCORPORATION BY REFERENCE

This application claims the benefit of U.S. Provisional Application No. 61/405,129, entitled "Efficient Regfile Implementation for Clock-Gating Design" filed on Oct. 20, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, a system, such as a computer system, a printer system, and the like, uses register files to store system configuration, control and status information. In some conventional systems, register files are implemented in byte enabled flip flop registers which offer partial register write configuration with byte resolution access. Such register files tend to be sub-optimal at least in terms of power efficiency and area.

SUMMARY

Aspects of the disclosure provide an integrated circuit. The integrated circuit includes a first register configured to store first multiple data units, a data input generation circuit configured to combine input data for at least partially overwriting the first register with the stored first multiple data units to generate combined input data, and a first clock-gating circuit configured to provide to the first register a logically controlled first gated clock signal having selectively enabled first transitions. The first register is overwritten with the combined input data in response to the first transitions in the first gated clock signal. Further, in an example, the integrated circuit includes a first enable logic circuit configured to generate a first clock enable signal to selectively enable the first transitions in the first gated clock signal.

According to an embodiment, the data input generation circuit is configured to combine the input data for partially overwriting the first register with the stored first multiple data units based on partial enable signals respectively corresponding to the first multiple data units. In an example, the data input generation circuit includes multiple multiplexers. Each multiplexer is configured to receive a first data unit in the input data and a second data unit in the stored first multiple data units, and select one of the first data unit and the second data unit based on a partial enable signal.

According to an aspect of the disclosure, the first register has a first register address. The integrated circuit further includes a second register configured to store second multiple data units. The second register has a second register address. The integrated circuit further includes an output multiplexer configured to select one of the first multiple data units and the second multiple data units as a response. The data input generation circuit is configured to combine the input data for partially overwriting one of the first register and the second register with the response to generate the combined input data. The integrated circuit includes a second clock-gating circuit configured to provide to the second register a logically controlled second gated clock signal having selectively enabled second transitions.

Further, the integrated circuit includes a first enable logic circuit configured to generate a first clock enable signal to selectively enable the first transitions in the first gated clock signal as a function of an address of the first register and a second enable logic circuit configured to generate a second clock enable signal to selectively enable the second transitions in the second gated clock signal as a function of an address of the second register.

Aspects of the disclosure provide a method. The method includes combining input data for partially overwriting a first register with data stored in the first register to generate combined input data, and providing to the first register a first gated clock signal having selectively enabled first transitions to cause the first register to be overwritten with the combined input data in response to the first selectively enabled transitions.

Aspects of the disclosure provide a system. The system includes a register block configured to store control, configuration and status information of the system. The register block includes a register configured to store multiple data units, a data input generation circuit configured to combine input data for partially overwriting the register with the stored multiple data units to generate combined input data and a clock-gating circuit configured to provide to the register a logically controlled gated clock signal having selectively enabled transitions. The register is overwritten with the combined input data in response to a transition in the gated clock signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
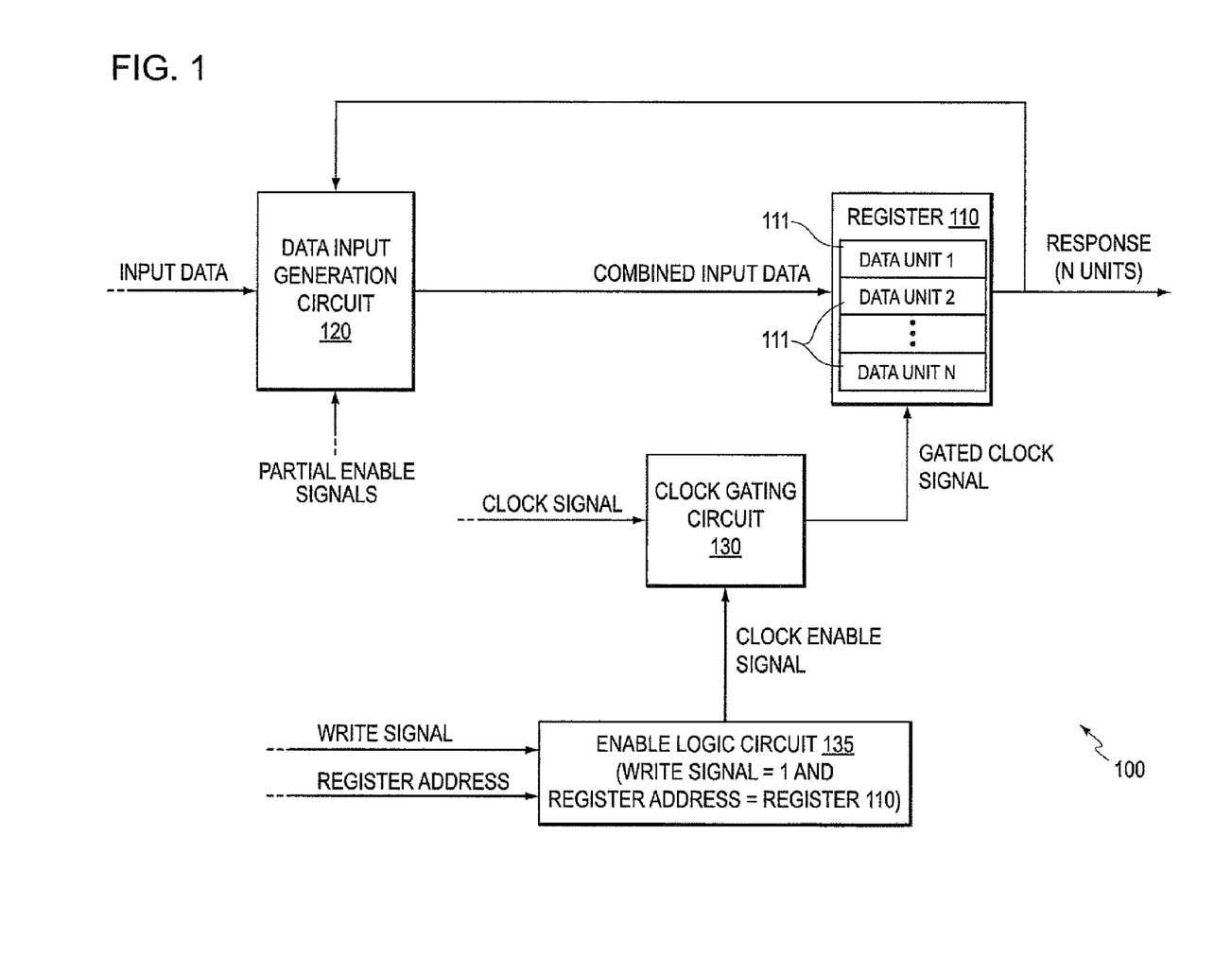
FIG. 1 shows a simplified block diagram of a register circuit example 100 according to an embodiment of the disclosure.

FIG. 1 shows a block diagram of a register circuit example 100 according to an embodiment of the disclosure. The register circuit 100 includes a register 110, a data input generation circuit 120, a clock gating circuit 130 and an enable logic circuit 135. These elements are coupled together as shown in FIG. 1.

In an embodiment, the register circuit 100 is a circuit block in an electronic system, such as a computer system, a printer system, and the like. The register circuit 100 stores control, configuration, and status information of the electronic system. In an example, the register circuit 100 of a computer system stores configuration settings and options for operating system software, such as Windows operating system, and the like, and configuration settings for application software running on the computer system. For example, the register circuit 100 of the computer system may store settings for kernel, device driver, user interface, and the like. The electronic system performs read operations to read the control, configuration and status information, and performs write operations to update the control, configuration and status information. For example, the operating system software and the application software of a computer system can access the register circuit 100 in the computer system to store the configuration settings and read the configuration settings.

Generally, high performance is not necessary for accessing the register circuit 100. In an example, storing configuration settings in the register circuit 100 is a part of system ramp-up. In the FIG. 1 example, the register circuit 100 is configured to perform either a write operation to write data into the register 110 or a read operation to read data stored in the register 110 at a time.

During a read operation, for example, the electronic system provides a register address for reading. When the register address is the address of the register 110, the electronic system receives a response corresponding to data stored in the register 110.

During a write operation, for example, the electronic system provides a write signal, input data, a register address for writing, and partial enable signals that indicate one or more portions in a register to be overwritten. When the register address is the address of the register 110, one or more portions of the register 110 are overwritten according to the input data, and data in the rest of the register 110 is kept unchanged.

In the FIG. 1 example, the register 110 includes storage components, such as D-flip-flops, and the like. The storage components are grouped into N storage units 111 (N is a positive integer number). Each storage unit 111 stores a data unit. It is noted that the data unit can be a bit, a byte, a word, or any number of bits. The outputs of the storage components correspond to the stored data, and form a response of the register 110. In an example, the register 110 is implemented using D flip-flops. The outputs of the D flip-flops correspond to the data stored in the D flip-flops and form the response of the register 110.

In an embodiment, the register 110 is configured to operate in response to a gated clock signal. For example, the gated clock signal is provided to each of the D-flip-flops in the register 110. Thus, the entire register 110 is overwritten in response to a transition in a gated clock signal. In the FIG. 1 example, the register 110 receives combined input data, and overwrites the storage components according to the combined input data in response to a transition, such as a rising edge transition or a falling edge transition, in the gated clock signal. Specifically, when the gated clock signal is at a substantially constant level, the register 110 maintains the data already stored in the register 110; and when the gated clock signal has a rising edge transition, for example, the voltage of the gated clock signal rises from a relatively low level to a relatively high level, the register 110 replaced the data stored in the register 110 with the combined input data. It is noted that, in an embodiment, all the storage components in the register 110 are overwritten according to the combined input data in response to a rising edge transition of the gated clock signal.

The data input generation circuit 120 receives the input data and the partial enable signals. In an embodiment, the partial enable signals indicate which storage units 111 to overwrite. The data input generation circuit 120 combines the input data with the response of the register 110, which is the data already stored in the register 110, based on the partial enable signals to generate the combined input data.

In an example, the data input generation circuit 120 receives N partial enable signals respectively corresponding to the N storage units 111. When a partial enable signal is logic "1", the register circuit 100 overwrites a storage unit 111 corresponding to the partial enable signal based on the input data; and when the partial enable signal is logic "0", the register circuit 100 keeps the stored data in the corresponding storage unit 111.

In an embodiment, the data input generation circuit 120 selects first portions of the input data and second portions of the response based on the partial enable signals, and combines the selected portions to generate the combined input data. For example, the input data includes N portions respectively corresponding to the N storage units 111, and the response includes N units respectively corresponding to data stored in the N storage units 111. When a partial enable signal corresponding to a storage unit 111 is logic "1", the data input generation circuit 120 selects the portion of the input data corresponding to the storage unit 111; and when the partial enable signal is logic "0", the data input generation circuit 120 selects a unit in the response that corresponds to the data stored in the storage unit 111. The selected portions are combined to form the combined input data.

The clock gating circuit 130 receives a clock signal, and a clock enable signal, and generates the gated clock signal based on the clock signal and the clock enable signal. In an example, when the clock enable signal is logic "1", the clock gating circuit 130 generates the gated clock signal having transitions in response to transitions in the clock signal; and when the clock enable signal is logic "0", the clock gating circuit 130 outputs the gated clock signal having a substantially constant voltage. In an embodiment, the storage units 111 include D flip-flops that are clocked using the gated clock signal. When the gated clock signal has a substantially constant voltage, the D flip-flops do not consume switching power.

The enable logic circuit 135 generates the clock enable signal based on enable conditions. In the FIG. 1 example, the clock enable signal is generated based on the write signal and the register address. The write signal indicates whether a register operation is a write operation, and the register address indicates which register for the register operation. In an example, when the write signal is logic "1", and the register address is the address for the register 110, the clock enable signal for the clock gating circuit 130 is set to logic "1"; otherwise, the clock enable signal is set to logic "0".

It is noted that the register circuit 100 is configured to use gated clock signal for overwriting the register 100. Because the gate clock signal includes transitions only when overwriting is needed, then, in an example, when overwriting is not needed, the gated clock signal maintains a relatively low voltage level. Thus, transistors in the D-flip-flops of the register 100 do not switch, and the register circuit 100 consumes reduced switching power. In addition, the register circuit 100 only needs one clock gating circuit 130 for the register 110 to enable clock gated partial overwritten, and thus the register circuit 100 consumes reduced silicon area.

Figure 2:
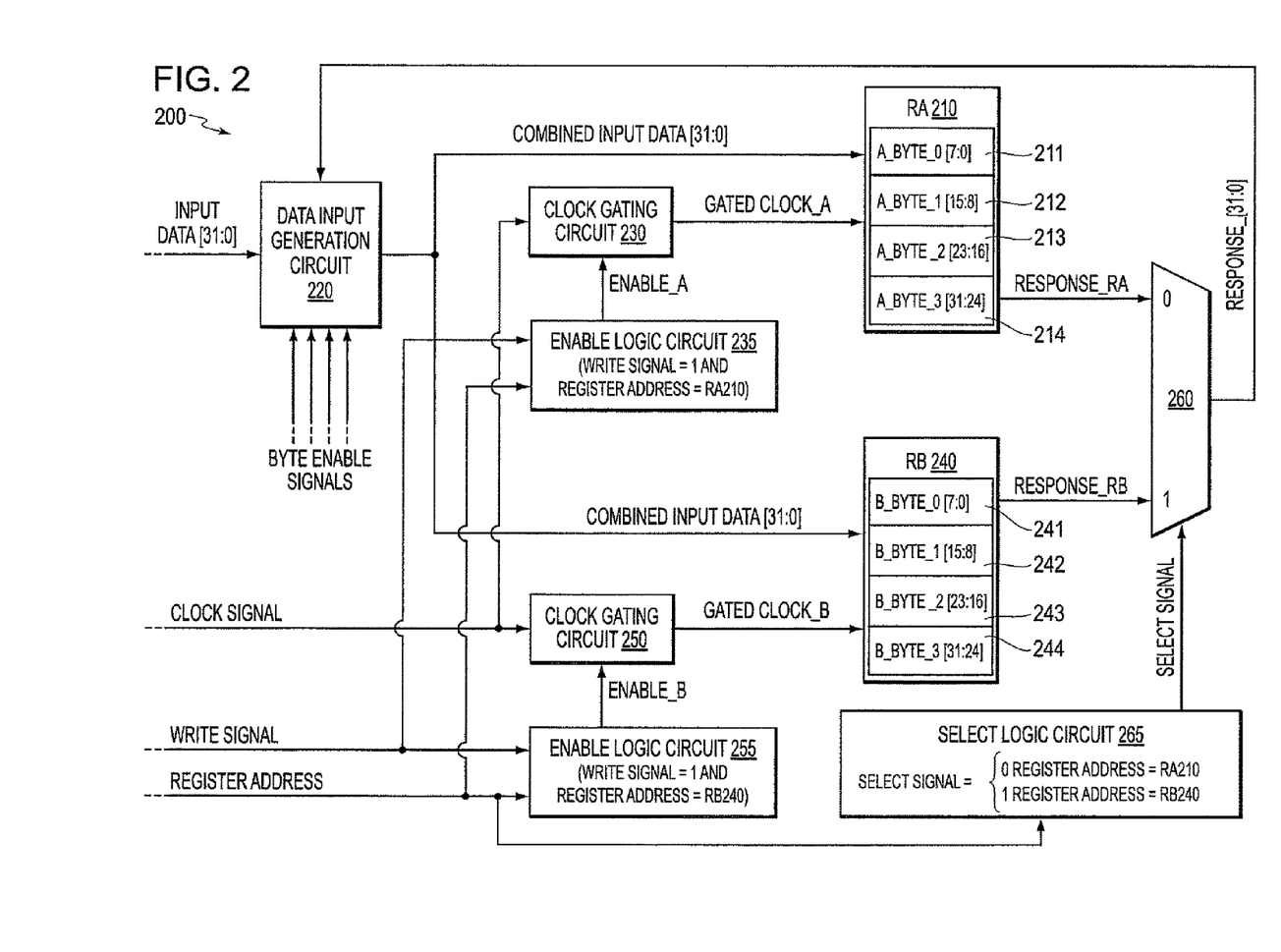
FIG. 2 shows a simplified block diagram of another register circuit example 200 according to an embodiment of the disclosure.

FIG. 2 shows a block diagram of a register circuit example 200 according to an embodiment of the disclosure. The register circuit 200 includes two registers RA 210 and RB 240, two clock gating circuits 230 and 250, two enable logic circuits 235 and 255, a data input generation circuit 220, an output multiplexer module 260, and a select logic circuit 265. These elements are coupled together as shown in FIG. 2.

According to an aspect of the disclosure, the register circuit 200 is configured to enable a byte-overwritten feature. Further, the register circuit 200 is configured to use gated clock signals for register overwriting, and thus the register circuit 200 consumes reduced switching power. In addition, the register circuit 200 only needs one clock gating circuit for each register to enable clock gated partial overwritten, and thus the register circuit 200 consumes reduced silicon area.

In an embodiment, similar to the register circuit 100, the register circuit 200 is a circuit block in an electronic system, such as a computer system, a printer system, and the like. The register circuit 200 stores control, configuration, and status information of the electronic system. The electronic system performs read operations to read the control, configuration and status information from the register circuit 200, and performs write operations to update the control, configuration and status information stored in the register circuit 200.

During a read operation, for example, the electronic system provides a register address to the register circuit 200. When the register address is the address of the RA 210, the electronic system receives a response corresponding to data stored in the RA 210; and when the register address is the address of the RB 240, the electronic system receives a response corresponding to data stored in the RB 240.

During a write operation, for example, the electronic system provides a write signal, input data, a register address, and byte enable signals that indicate one or more bytes in a register. When the register address is the address of the RA 210, one or more bytes of the RA 210 are overwritten according to the input data, and data in the rest of the RA 210 and data in the RB 240 is kept unchanged. When the register address is the address of the RB 240, one or more bytes of the RB 240 are overwritten according to the input data, and data in the rest of the RB 240 and data in the RA 210 is kept unchanged.

In the FIG. 2 example, the RA 210 includes 32 D flip-flops that are numbered from 0 to 31. The 32 D flip-flops are grouped into byte-size storage units 211-214. The byte-size storage unit 211 includes D flip-flops 0 to 7, and stores a first byte A_BYTE_0; the byte-size storage unit 212 includes D flip-flops 8 to 15, and stores a second byte A_BYTE_1; the byte-size storage unit 213 includes D flip-flops 16 to 23, and stores a third byte A_BYTE_2; and the byte-size storage unit 214 includes D flip-flops 24 to 31, and stores a fourth byte A_BYTE_3. The outputs of the 32 D flip-flops correspond to the stored data, and form a response RESPONSE_RA of the RA 210.

Further, the RA 210 receives 32 bits combined input data, and updates the 32 D flip-flops according to the combined input data in response to a transition, such as a rising edge transition or a falling edge transition, in a first gated clock signal GATED CLOCK_A. Specifically, when the GATED CLOCK_A is at a substantially constant level, 32 D flip-flops keep the stored data; and when the GATED CLOCK_A has a rising edge transition, for example, the voltage of the GATED CLOCK_A rises from a relatively low voltage to a relatively high voltage, the combined input data is written into the 32 D flip-flops of the RA 210.

The RB 240 also includes 32 D flip-flops that are numbered from 0 to 31 The 32 D flip-flops are grouped into byte-size storage units 241-244. The byte-size storage unit 241 includes D flip-flops 0 to 7, and stores a first byte B_BYTE_0; the byte-size storage unit 242 includes D flip-flops 8 to 15, and stores a second byte B_BYTE_1; the byte-size storage unit 243 includes D flip-flops 16 to 23, and stores a third byte B_BYTE_2; and the byte-size storage unit 244 includes D flip-flops 24 to 31, and stores a fourth byte B_BYTE_3. The outputs of the 32 D flip-flop correspond to the stored data, and form a response RESPONSE_RB of the RB 240.

Further, the RB 240 receives the 32 bits combined input data, and updates the 32 D flip-flops according to the combined input data in response to a transition, such as a rising edge transition or a falling edge transition, in a second gated clock signal GATED CLOCK_B. Specifically, when the GATED CLOCK_B is at a substantially constant level, the 32 D flip-flops keep the stored data; and when the GATED CLOCK has a rising edge transition, for example, the voltage of the GATED CLOCK_B rises from a relatively low voltage to a relatively high voltage, the combined input data is written into the 32 D flip-flops of RB 240.

The output multiplexer 260 selects one of RESPONSE_RA and RESPONSE_RB as the response of the register circuit 200 based on a select signal. The select signal is generated based on the register address. In the FIG. 2 example, the select logic circuit 265 generates the select signal. For example, when the register address corresponds to the address of RA 210, the select signal is set to logic "0"; and when the register address corresponds to the address of RB 240, the select signal is set to logic "1".

The data input generation circuit 220 receives the input data, the response of the register circuit 200, and the byte enable signals. In an embodiment, the byte enable signals indicate which byte size storage units to overwrite. The data input generation circuit 220 combines the input data with the response of the register circuit 200 based on the byte enable signals to generate the combined input data. It is also noted that because the response of the register circuit 200 is selected based on the register address, the combined input data is also a function of the register address.

Specifically, when the register address is the address of the RA 210, the response of the register circuit 200 corresponds to the data in the RA 210. Then, the data input generation circuit 220 combines the input data with the data in the RA 210 based on the byte enable signals to generate the combined input data. When the register address is the address of the RB 240, the response of the register circuit 200 corresponds to the data in the RB 240. Then, the data input generation circuit 220 combines the input data with the data in the RB 240 based on the byte enable signals to generate the combined input data.

In the FIG. 2 example, the data input generation circuit 220 receives four bytes (32 bits) of input data, four bytes (32 bits) of the response of register circuit 200, and four byte enable signals respectively corresponding to the four bytes. The data input generation circuit 220 selects bytes from the input data and the response based on the byte enable signals, and combines the selected bytes to generate the combined input data.

When a byte enable signal is logic "1", the data input generation circuit 220 selects a byte of the input data corresponding to the byte enable signal; and when the byte enable signal is logic "0", the data input generation circuit 220 selects a byte in the response. The selected bytes are combined to form the combined input data. For example, when the four byte enable signals are "0101", the data input generation circuit 220 selects the first and third bytes from the input data as the first and third bytes of the combined input data, and selects the second and fourth bytes from the response as the second and fourth bytes of the combined input data.

The combined input data are provided to both of the RA 210 and the RB 240. The RA 210 is overwritten according to the combined input data in response to a transition in the GATED CLOCK_A, and the RB 240 is overwritten according to the combined input data in response to a transition in the GATED CLOCK_B.

The clock gating circuit 230 receives a clock signal, and an enable signal ENABLE_A, and generates the GATED CLOCK_A based on the clock signal and the ENABLE_A. In an example, when the ENABLE_A is logic "1", the clock gating circuit 230 outputs the GATED CLOCK_A having transitions in response to transitions in the clock signal; and when the ENABLE_A is logic "0", the clock gating circuit 230 outputs the GATED CLOCK_A having a substantially constant voltage.

The enable logic circuit 235 generates the ENABLE_A based on enable conditions. In the FIG. 2 example, the ENABLE_A is generated based on the write signal and the register address. The write signal indicates whether a register operation is a write operation, and the register address indicates which register for the register operation. In an example, when the write signal is logic "1", and the register address is the address for the RA 210, the ENABLE_A for the clock gating circuit 230 is set to logic "1"; otherwise, the ENABLE_A is set to logic "0".

The clock gating circuit 250 receives the clock signal, and an enable signal ENABLE_B, and generates the GATED CLOCK_B based on the clock signal and the ENABLE_B. In an example, when the ENABLE_B is logic "1", the clock gating circuit 250 generates the GATED CLOCK_B having transitions in response to transitions in the clock signal; and when the ENABLE_B is logic "0", the clock gating circuit 250 outputs the GATED CLOCK_B having a substantially constant voltage.

The enable logic circuit 255 generates the ENABLE_B based on enable conditions. In the FIG. 2 example, the ENABLE_B is generated based on the write signal and the register address. In an example, when the write signal is logic "1", and the register address is the address for the RB 240, the ENABLE_B for the clock gating circuit 250 is set to logic "1"; otherwise, the ENABLE_B is set to logic "0".

During a read operation, when the register address is the address of the RA 210, the output multiplexer 260 selects RESPONSE_RA as the response of the register circuit 200; and when the register address is the address of RB 240, the output multiplexer 260 selects RESPONSE_RB as the response of the register circuit 200.

During a write operation, the write signal is logic "1". When the register address is the address of the RA 210, the output multiplexer 260 selects RESPONSE_RA as the response of the register circuit 200. The data input generation circuit 220 combines the input data with the response based on the byte enable signals to generate the combined input data. Further, the enable logic circuit 235 sets ENABLE_A as logic "1" to enable transitions in the GATED CLOCK_A, and the enable logic circuit 255 sets ENABLE_B as logic "0" to disable transitions in the GATED CLOCK_B. Thus, the combined data are written into the D flip-flops in RA 210.

Similarly, during a written operation that the register address is the address of the RB 240, the output multiplexer 260 selects RESPONSE_RB as the response of the register circuit 200. The data input generation circuit 220 combines the input data with the response based on the byte enable signals to generate the combined input data. Further, the enable logic circuit 235 sets ENABLE_A as logic "0" to disable transitions in the GATED CLOCK_A, and the enable logic circuit 255 sets ENABLE_B as logic "1" to enable transitions in the GATED CLOCK_B. Thus, the combined data are written into the D flip-flops in RB 240.

Figure 3:
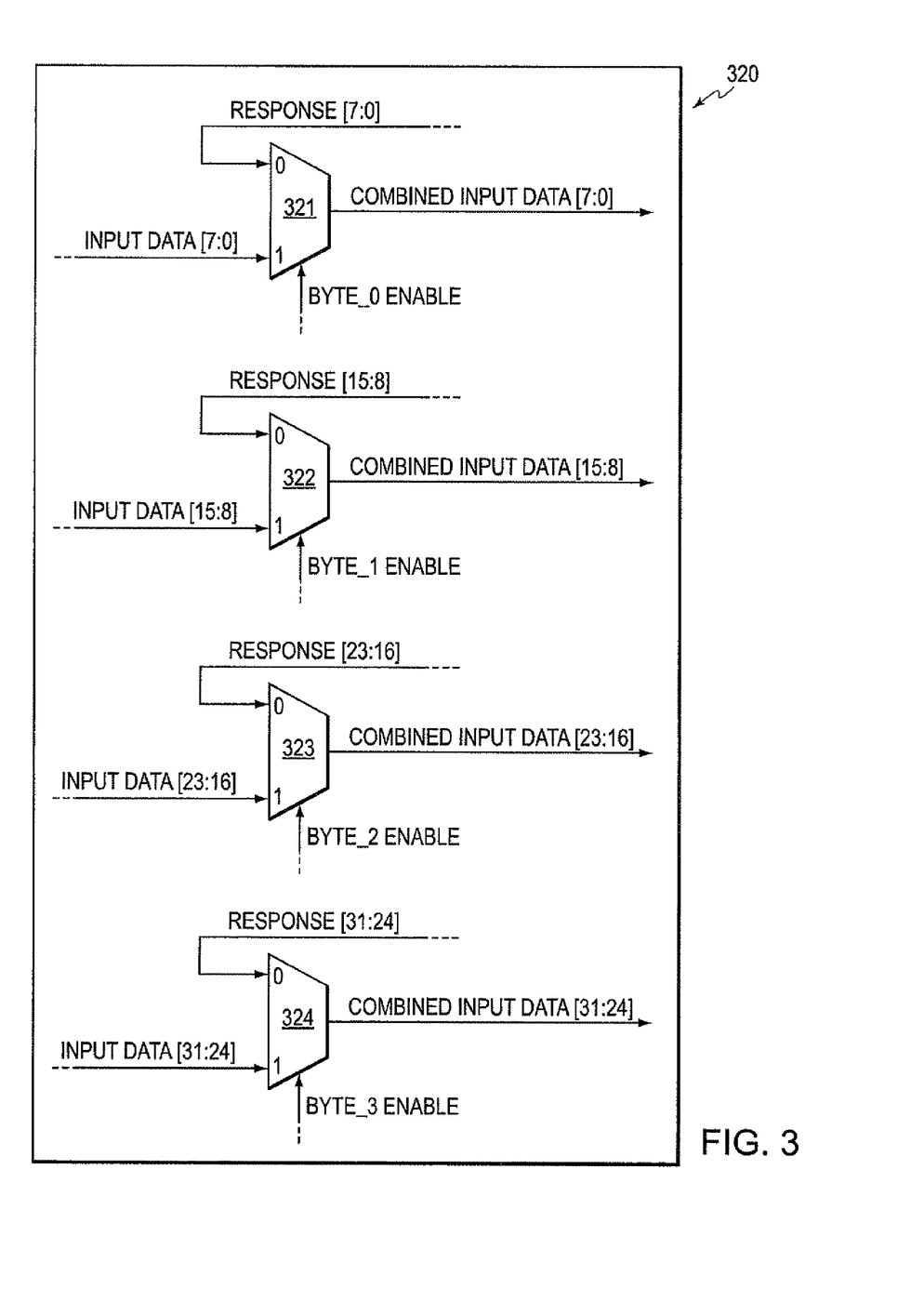
FIG. 3 shows a block diagram of a data input generation circuit 320 according to an embodiment of the disclosure.

FIG. 3 shows a block diagram of a data input generation circuit 320 according to an embodiment of the disclosure. The data input generation circuit 320 includes a first multiplexer module 321, a second multiplexer module 322, a third multiplexer module 323 and a fourth multiplexer module 324.

The first multiplexer module 321 receives the first byte (RESPONSE [7:0]) of the response and the first byte (INPUT DATA [7:0]) of the input data, and selects one of the bytes as the first byte (COMBINED INPUT DATA [7:0]) of the combined input data according to BYTE_0 ENABLE. For example, when BYTE_0 ENABLE is logic "0", the first multiplexer module 321 selects RESPONSE [7:0] as COMBINED INPUT DATA [7:0]; and when BYTE_0 ENABLE is logic "1", the first multiplexer module 321 selects INPUT DATA [7:0] as COMBINED INPUT DATA [7:0].

The second multiplexer module 322 receives the second byte (RESPONSE [15:8]) of the response, and the second byte (INPUT DATA [15:8]) of the input data, and selects one of the bytes as the second byte (COMBINED INPUT DATA [15:8]) of the combined input data according to BYTE_1 ENABLE. For example, when BYTE_1 ENABLE is logic "0", the second multiplexer module 322 selects RESPONSE [15:8] as COMBINED INPUT DATA [15:8]; and when BYTE_1 ENABLE is logic "1", the second multiplexer module 322 selects INPUT DATA [15:8] as COMBINED INPUT DATA [15:8].

The third multiplexer module 323 receives the third byte (RESPONSE [23:16]) of the response, and the third byte (INPUT DATA [23:16]) of the input data, and selects one of the bytes as the third byte (COMBINED INPUT DATA [23:16]) of the combined input data according to BYTE_2 ENABLE. For example, when BYTE_2 ENABLE is logic "0", the third multiplexer module 323 selects RESPONSE [23:16] as COMBINED INPUT DATA [23:16]; and when BYTE_2 ENABLE is logic "1", the third multiplexer module 323 selects INPUT DATA [23:16] as COMBINED INPUT DATA [23:16].

The fourth multiplexer module 324 receives the fourth byte (RESPONSE [31:24]) of the response, and the fourth byte (INPUT DATA [31:24]) of the input data, and selects one of the bytes as the fourth byte (COMBINED INPUT DATA [31:24]) of the combined input data according to BYTE_3 ENABLE. For example, when BYTE_3 ENABLE is logic "0", the fourth multiplexer module 324 selects RESPONSE [31:24] as COMBINED INPUT DATA [31:24]; and when BYTE_3 ENABLE is logic "1", the fourth multiplexer module 324 selects INPUT DATA [31:24] as COMBINED INPUT DATA [31:24].

Figure 4:
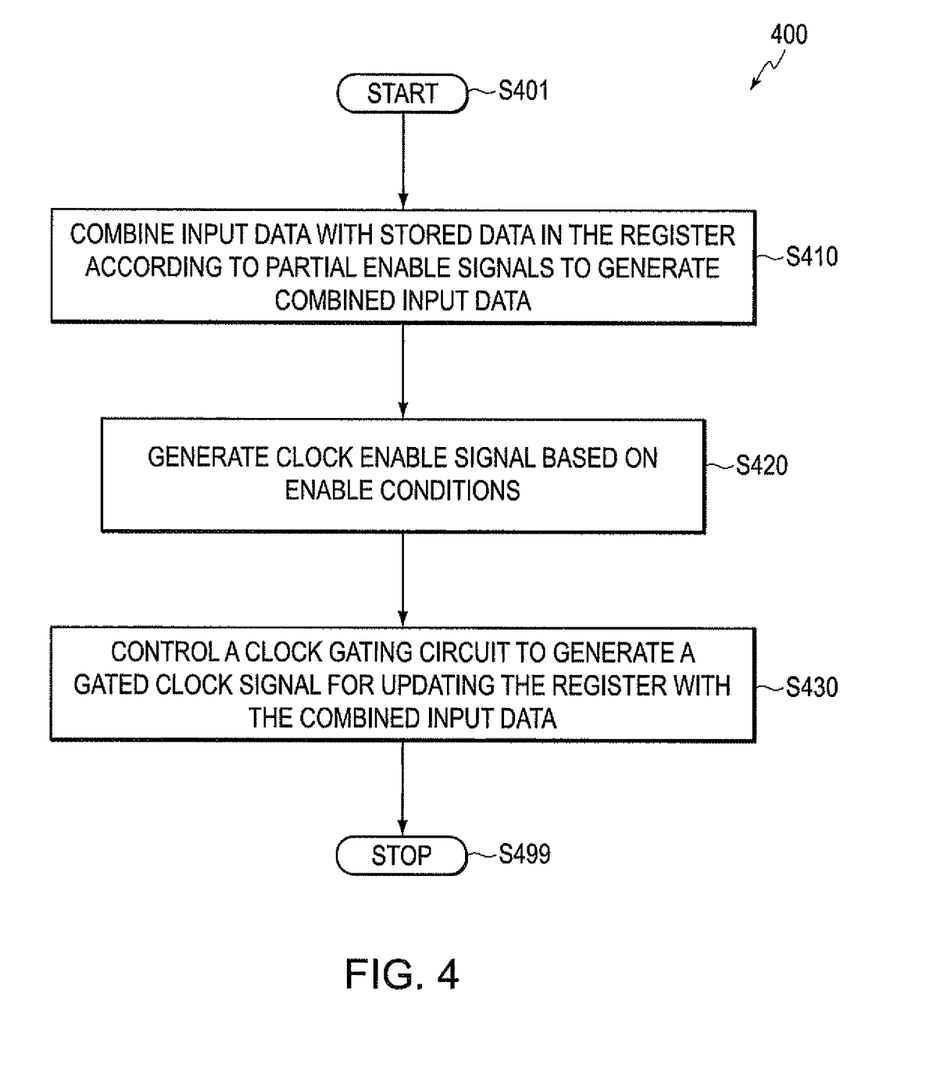
FIG. 4 shows a flow chart outlining a process example 400 for a register circuit to perform a write operation according to an embodiment of the disclosure.

FIG. 4 shows a flow chart outlining a process example 400 for a register circuit, such as the register circuit 100, to perform a write operation according to an embodiment of the disclosure. The register circuit includes a register having multiple storage units. The register circuit is configured to overwrite one or more storage units according to input data and keep data in the rest of the storage units unchanged. The register circuit receives the input data, a register address, a write signal and partial enable signals. The write signal indicates the write operation. When the register address is the address of the register in the register circuit, the register circuit performs the write operation to partially write the input data into the register. The partial enable signals indicate which storage units for overwritten. The process starts at S401 and proceeds to S410.

At S410, the register circuit combines the input data with stored data in the register according to the partial enable signals to generate combined input data.

At S420, the register circuit generates a clock enable signal based on enable conditions. For example, when the write signal is logic "1", and the register address is the address of the register in the register circuit, the clock enable signal is set to logic "1"; otherwise, the clock enable signal is set to logic "0".

At S430, the register circuit uses the clock enable signal to control a clock gating circuit to generate a gated clock signal for updating the register with the combined input data. Then, the process proceeds to S499 and terminates.

According to an aspect of the disclosure, the register circuit 100 and the register circuit 200 can be automatically generated using a synthesis tool, such as RTL Compiler from Cadence, and the like. In an example, during a design process, an intermediate register circuit includes register transfer level (RTL) code for enable conditions. Then, a processor executes synthesis software to convert the intermediate register circuit into a clock gated register circuit, such as the register circuit 100 and the register circuit 200.

Figure 5:
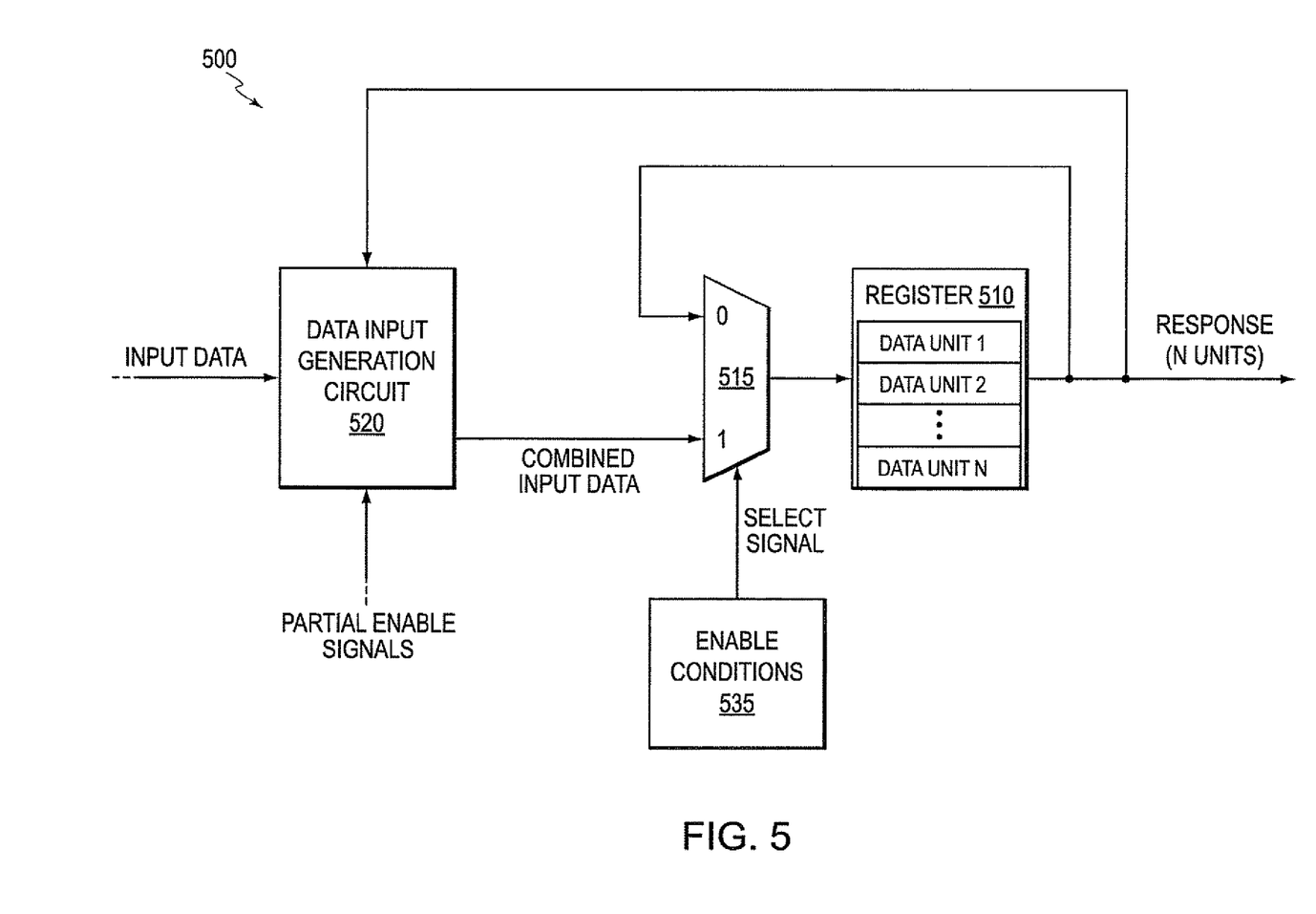
FIG. 5 shows a block diagram of an intermediate register circuit 500 corresponding to the register circuit 100 at an intermediate design step according to an embodiment of the disclosure.

FIG. 5 shows a block diagram of an intermediate register circuit 500 corresponding to the register circuit 100 at an intermediate design step according to an embodiment of the disclosure. The intermediate register circuit 500 includes a register 510, a data input generation circuit 520, a multiplexer 515, and enable conditions 535. These elements are coupled together as shown in FIG. 5.

The register 510 is identical or equivalent to the register 110, and the data input generation circuit 520 is identical or equivalent to the data input generation circuit 120; the description of register 510 and the data input generation circuit 520 has been provided above and will be omitted here for clarity purposes. The enable conditions 535 include RTL code of enable conditions. The multiplexer module 515 selects one of the response or the combined input data based on a select signal. For example, when the select signal is logic "1", the multiplexer module 515 selects the combined input data, and then the data stored in the register 510 is replaced with the combined input data; and when the select signal is logic "0", the multiplexer module 515 selects the response, which is the same as the present data stored in the register 510, and then the same data as stored in the register 510 is written to the register 510. The select signal is generated based on the enable conditions 535. For example, the enable conditions include the write signal being logic "1" and the register address being the address of the register 510.

In an embodiment, the intermediate register circuit 500 is coded in RTL, and is input into a synthesis tool. The synthesis tool automatically converts the intermediate register circuit 500 into the clock gated register circuit 100.

Figure 6:
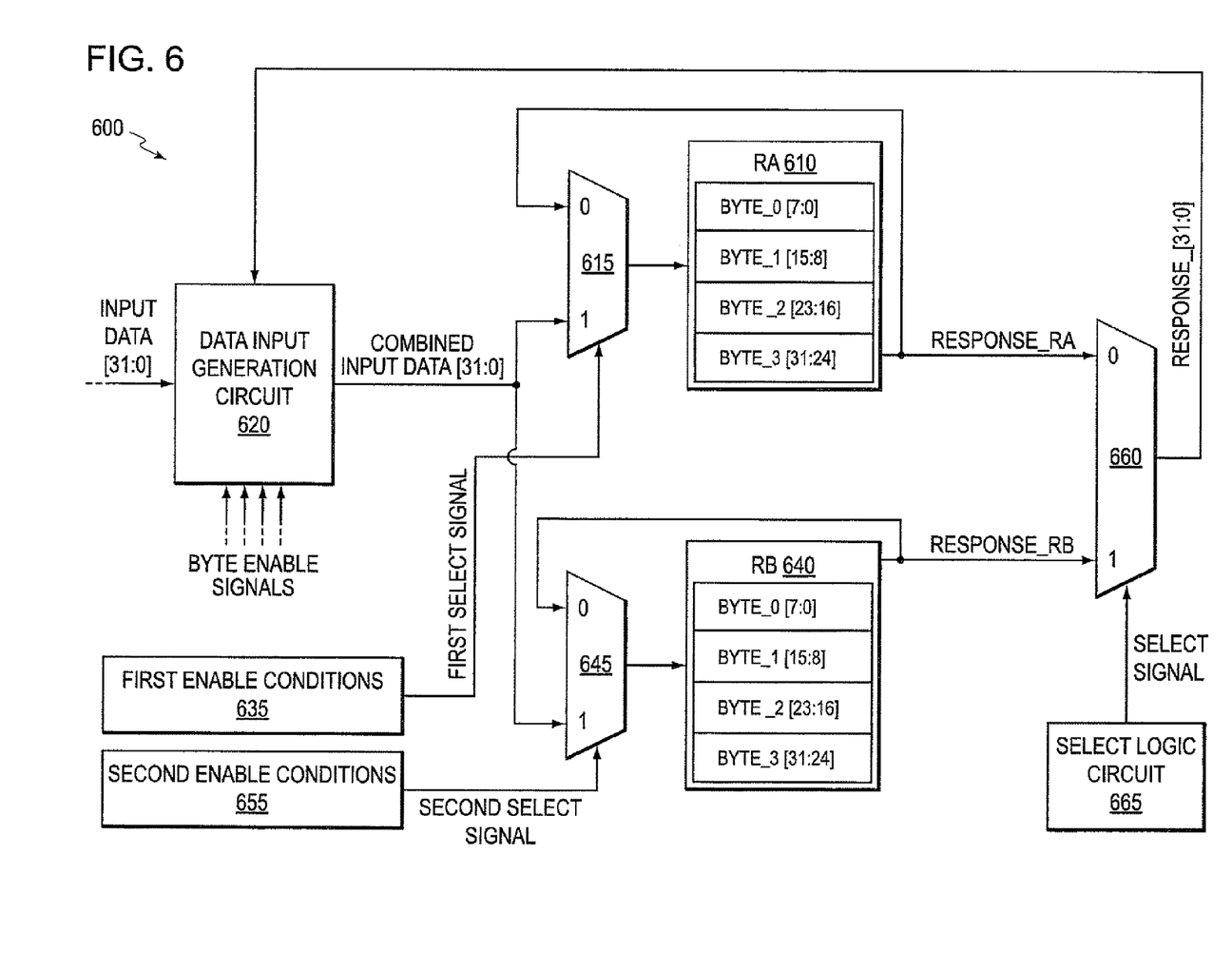
FIG. 6 shows a block diagram of an intermediate register circuit 600 corresponding to the register circuit 200 at an intermediate design step according to an embodiment of the disclosure.

FIG. 6 shows a block diagram of an intermediate register circuit 600 corresponding to the register circuit 200 at an intermediate design step according to an embodiment of the disclosure. The intermediate circuit 600 includes two registers RA 610 and RB 640, two multiplexer modules 615 and 645, first enable conditions 635, second enable conditions 655, a data input generation circuit 620, an output multiplexer 660, and a select logic circuit 665. These elements are coupled together as shown in FIG. 6.

The RA 610 is identical or equivalent to the RA 210, the RB 640 is identical or equivalent to the RB 240, the output multiplexer 660 is identical or equivalent to the output multiplexer 260, the data input generation circuit 620 is identical or equivalent to the data input generation circuit 220, and the select logic circuit 665 is identical or equivalent to the select logic circuit 265; the description of RA 610, RB 640, the output multiplexer 660, the select logic circuit 665 and the data input generation circuit 620 has been provided above and will be omitted here for clarity purposes.

The first enable conditions 635 include RTL code of first enable conditions. The multiplexer module 615 selects one of the response or the combined input data based on a first select signal. The first select signal is generated based on the first enable conditions 635. For example, the first enable conditions 635 include the write signal being logic "1" and the register address being the address of the RA 610.

The second enable conditions 655 include RTL code of second enable conditions. The multiplexer module 645 selects one of the response or the combined input data based on a second select signal. The second select signal is generated based on the second enable conditions 655. For example, the second enable conditions 655 include the write signal being logic "1" and the register address being the address of the RB 640.

In an embodiment, the intermediate register circuit 600 is coded in RTL, and is input into a synthesis tool. The synthesis tool automatically converts the intermediate register circuit 600 into the clock gated register circuit 200.

While the subject matter of the present disclosure has been described in conjunction with the specific embodiments thereof that are proposed as examples, it is evident that many alternatives, modifications, and variations will be apparent to those skilled in the art. Accordingly, embodiments of the present disclosure as set forth herein are intended to be illustrative, not limiting. There are changes that may be made without departing from the scope of the present disclosure.

What is claimed is:

1. An integrated circuit, comprising:
a first register configured to store first multiple data units;
a data input generation circuit configured to combine input data for at least partially overwriting the first register with the stored first multiple data units to generate combined input data; and
a first clock-gating circuit configured to provide to the first register a logically controlled first gated clock signal having selectively enabled first transitions, the first register being overwritten with the combined input data in response to a transition in the first gated clock signal.

2. The integrated circuit of claim 1, further comprising:
a first enable logic circuit configured to generate a first clock enable signal to selectively enable the first transitions in the first gated clock signal.

3. The integrated circuit of claim 1, wherein the data input generation circuit is configured to combine the input data for partially overwriting the first register with the stored first multiple data units based on partial enable signals respectively corresponding to the first multiple data units.

4. The integrated circuit of claim 3, wherein the data input generation circuit includes multiple multiplexers, each multiplexer being configured to receive a first data unit in the input data and a second data unit in the stored first multiple data units, and to select one of the first data unit and the second data unit based on a partial enable signal.

5. The integrated circuit of claim 1, wherein the first register is configured to store at least one of control, configuration, and status information of a system.

6. The integrated circuit of claim 1, wherein:
the first register has a first register address;
a second register is configured to store second multiple data units, the second register having a second register address;
an output multiplexer configured to select one of the first multiple data units and the second multiple data units as a response;
the data input generation circuit is configured to combine the input data for partially overwriting one of the first register and the second register with the response to generate the combined input data; and a second clock-gating circuit configured to provide to the second register a logically controlled second gated clock signal having selectively enabled second transitions.

7. The integrated circuit of claim 6, further comprising:
a first enable logic circuit configured to generate a first clock enable signal to selectively enable the first transitions in the first gated clock signal as a function of an address of the first register; and
a second enable logic circuit configured to generate a second clock enable signal to selectively enable the second transitions in the second gated clock signal as a function of an address of the second register.

8. The integrated circuit of claim 1, wherein the first register is configured to store at least one of multiple bits, multiple bytes, and multiple words.

9. A method, comprising:
combining input data for partially overwriting a first register with data stored in the first register to generate combined input data; and
providing to the first register a first gated clock signal having selectively enabled first transitions to cause the first register to be overwritten with the combined input data in response to the first selectively enabled transitions.

10. The method of claim 9, wherein combining the input data for partially overwriting the first register with the data stored in the first register to generate the combined input data further comprises:
combining the input data with the data stored in the first register based on partial enable signals respectively corresponding to multiple portions of the first register.

11. The method of claim 10, wherein combining the input data with the data stored in the first register based on partial enable signals respectively corresponding to the multiple portions of the first register further comprises:
selecting first bytes from the input data and second bytes from the data stored in the first register based on the partial enable signals corresponding to byte size storage units of the first register; and
combining the first bytes and the second bytes to generate the combined input data.

12. The method of claim 9, further comprising:
selecting one of first data stored in the first register and second data stored in a second register to be combined with the input data to generate the combined input data.

13. The method of claim 12, further comprising:
providing to the second register a second gated clock signal having selectively enabled second transitions to cause the second register to be overwritten with the combined input data in response to the selectively enabled second transitions.

14. The method of claim 9, further comprising:
selectively enabling the first transitions in the first gated clock signal based on a write signal and a register address of the first register.

15. A system, comprising:
a register block configured to store control, configuration and status information of the system, the register block including:
a first register configured to store first multiple data units;
a data input generation circuit configured to combine input data for partially overwriting the first register with the stored first multiple data units to generate combined input data; and
a first clock-gating circuit configured to provide to the first register a logically controlled first gated clock signal having selectively enabled first transitions, the first register being overwritten with the combined input data in response to first transitions in the first gated clock signal.

16. The system of claim 15, wherein the register block further comprises:
a first enable logic circuit configured to generate a first clock enable signal to selectively enable the first transitions of the first gated clock signal.

17. The system of claim 15, wherein the data input generation circuit is configured to combine the input data for partially overwriting the first register with the stored multiple data units based on partial enable signals respectively corresponding to the first multiple data units.

18. The system of claim 17, wherein the data input generation circuit includes multiple multiplexers, each multiplexer being configured to receive a first data unit in the input data and a second data unit in the stored first multiple data units, and to select one of the first data unit and the second data unit based on a partial enable signal.

19. The system of claim 15, wherein the register block further comprises:
a second register configured to store second multiple data units;
an output multiplexer configured to select one of the first multiple data units and the second multiple data units as a response; and
a second clock-gating circuit configured to provide to the second register a logically controlled second gated clock signal having selectively enabled second transitions for overwriting the second register with the combined input data.

20. The system of claim 19, further comprising:
a first enable logic circuit configured to generate a first clock enable signal to selectively enable the first transitions in the first gated clock signal as a function of an address of the first register; and
a second enable logic circuit configured to generate a second clock enable signal to selectively enable the second transitions in the second clock signal as a function of an address of the second register.

\* \* \* \* \*